United States Patent [19]
Korovin et al.

[11] 3,935,585
[45] Jan. 27, 1976

[54] SEMICONDUCTOR DIODE WITH VOLTAGE-DEPENDENT CAPACITANCE

[76] Inventors: Stanislav Konstantinovich Korovin, ulitsa Zelenaya, 8., Moskovskaya oblast Domodedovo; Igor Ivanovich Kruglov, 15 Parkovaya ulitsa, 46, korpus 1, kv. 35, Moscow; Konstantin Andreevich Preobrazhentsev, ulitsa Narodnogo opolchenia, 16, korp. 3, kv. 8, Moscow; Jury Ivanovich Sidorov, Zelenograd, Korp. 503, kv. 104, Moscow; Stanislav Vladislavovich Fronk, Sirenevy bulvar, 36, kv. 154, Moscow, all of U.S.S.R.

[22] Filed: Feb. 22, 1974

[21] Appl. No.: 444,983

Related U.S. Application Data
[63] Continuation of Ser. No. 282,840, Aug. 22, 1972, abandoned.

[52] U.S. Cl. ................ 357/14; 357/15; 357/55; 357/68
[51] Int. Cl.² .......................................... H01L 29/92
[58] Field of Search .................. 357/14, 15, 68, 55

[56] References Cited
UNITED STATES PATENTS

| | | |
|---|---|---|
| 2,989,650 | 6/1961 | Doucette et al. ............... 357/14 |
| 3,093,755 | 6/1963 | Haberecht et al. ............... 357/14 |
| 3,176,151 | 3/1965 | Atalla et al. ............... 357/14 |
| 3,233,196 | 2/1966 | Osafune et al. ............... 357/14 |
| 3,307,088 | 2/1967 | Fujikawa ............... 357/14 |
| 3,532,945 | 10/1970 | Weckler ............... 357/14 |
| 3,544,395 | 12/1970 | Terasaki ............... 357/14 |
| 3,764,415 | 10/1973 | Raabe et al. ............... 357/14 |

*Primary Examiner*—Andrew J. James
*Attorney, Agent, or Firm*—Haseltine, Lake & Waters

[57] ABSTRACT

A semiconductor wafer constituting a diode with voltage-dependent capacitance, having an N-type base layer and two P-type layers forming together two P-N junctions. The area of one of the P-N junctions is 30 to 50 times greater than that of the other P-N junction. The larger P-N junction of the semiconductor diode is energized by a positive potential, thus becoming forward-biased, while the smaller junction is energized by a negative potential, becoming reverse-biased. The resulting barrier capacitance of the reverse-biased junction determines capacitance, and its variation with temperature is compensated by a simultaneously changing potential of the two P-N junctions.

3 Claims, 1 Drawing Figure

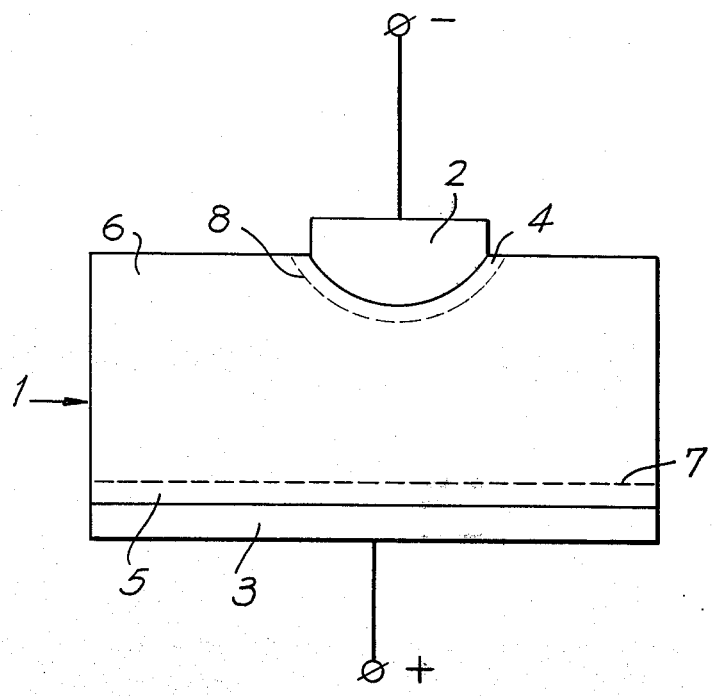

SEMICONDUCTOR DIODE WITH VOLTAGE-DEPENDENT CAPACITANCE

This application is a continuation of Ser. No. 282,840 filed Aug. 22, 1972, entitled "A Semiconductor Diode Using A Voltage-Dependent Capacitor," now abandoned The present invention relates to improved semiconductor devices, and more particularly to a semiconductor diode with voltage-dependent capacitance, that may be used for the electronic retuning of resonance circuits in radio and television equipment in a wide frequency range.

In technical literature, the inventive device is often referred to as a "tuning capacitor," a "Varicap" or a "Varactor."

A nonlinear capacitor is typically based on a monocrystalline semiconductor wafer, as for instance a silicon wafer, in the form of a two-layer structure, one layer being P-type, the other N-type. Confined between the layers is a narrow high-resistance region with a high majority carrier concentration, in the order of $10^{19}$ to $10^{20}$ cm$^{-3}$.

In some cases, such devices are multilayer structures with alternating P-type and N-type layers. Such a multilayer structure comprises substantially two-layer structures connected in series via a metallic low-resistance contact. In order that such structures function as capacitors, they are reverse-biased.

Thus, a nonlinear capacitor is actually a monocrystalline semiconductor diode operating under reverse-bias conditions. The controllable parameter of the capacitor is the P-N junction barrier capacitance, dependent on the applied voltage, the capacitance being determined by the formation of a P-N junction space-charge layer.

The width of the space-charge layer is determined by the applied voltage, therefore a reverse-biased P-N junction may be regarded as a capacitor the capacitance value whereof depends on the applied voltage value. As the voltage increases, the capacitance decreases because the space-charge layer is extended into the high-resistance layer.

The P-N junction capacitance variation in the forward bias region, the so called diffusion capacitance, cannot be regarded as a controllable parameter of the capacitor because the capacitor Q-factor decreases sharply at high positive voltages.

Hence of practical interest, as regards capacitance control, is the use of a negative bias at this junction as it ensures a high Q-factor of the capacitor, as well as a low inherent noise level, and it renders the capacitance independent of frequency down to the millimeter waveband frequencies.

The P-N junction barrier capacitance under consideration $C_1 1 l$ ) may be mathematically written as:

$$C_1 = \frac{d_q}{d(u)} = \epsilon_o \frac{\epsilon 1^s}{h}$$

wherein $d_q$ is the charge increment when the voltage increases by the value of du;

u is the maximum voltage applied to the P-N junction;

$\epsilon_o$ is the permittivity of vacuum;
$\epsilon$ is the absolute permittivity of the medium;
S is the area of the P-N junction; and
h is the width of the P-N junction space-charge layer.

The distinguishing feature of a semiconductor nonlinear capacitor is the dependence on voltage of the width of the P-N junction space-charge layer, which dependence is determined by the distribution of the impurity concentration in the space-charge region.

Conventional semiconductor nonlinear capacitors, of which the P-N junction is made by alloying or by diffusion, have practically a constant or a linearly increasing impurity concentration at the junction base, and ensure an inverse relationship between the barrier capacitance and the square or cube root of the bias voltage value.

A higher bias voltage sensitivity of the capacitance is obtained by means of a reciprocal gradient of the impurity concentration, i.e., by means of a distribution wherein the active impurity atom concentration decreases in a direction opposite to the junction boundary.

A semiconductor nonlinear capacitance is characterized by a variety of specific parameter, namely: the maximum-to-minimum capacitance ratio within a specified inverse voltage range; the volt-farad characteristic, i.e. the required mode of a capacitance-inverse voltage relation; the Q-factor, i.e., the lowest possible resistance losses; the temperature sensitivity, i.e., the changeability of the capacitance with temperature. The extent to which the capacitance may change with temperature is characterized by the so-called temperature capacitance coefficient (TCC) which is one of the main features of a semiconductor capacitor and is determined as a relative capacitance variation with temperature mathematically expressed as $$TCC = \frac{1}{C} \frac{\delta C}{\delta T}$$

where
  C is the capacitance of the capacitor and T is the temperature in °K.

From the physical standpoint, the capacitance variation with temperature is accounted for by the temperaturedependence of the permittivity ($\epsilon$) and of the contact potential difference ($\phi$). The variation of the temperature capacitance coefficient due to temperature dependence of the contact potential difference is found to be inversely proportional to the bias voltage and directly proportional to the nonlinearity coefficient of the capacitor. By the nonlinearity coefficient is meant a quotient of a relative capacitor capacitance variation by the responsible relative bias voltage variation.

The contact potential difference variation exerts the greatest influence upon the temperature capacitance coefficient and brings about an increase of the capacitance with temperature. For example, in a semiconductor nonlinear capacitor device with a silicon wafer having a relation $C(u) = A(\phi + u)^{-1/2}$, where $C(u)$ is the capacitor capacitance, A is the proportionality constant, u is the bias voltage, the temperature coefficient changes within a temperature range of −60° to +120°C at a reverse-bias voltage of −4 V, by $300.10^{-6}$ 1/°C. Still more sensitive to temperature variations is a capacitor with a reciprocal gradient of the impurity concentration at the P-N junction.

Such temperature capacitance coefficient variations decrease the stability of a circuit using a device of the described type, and make the latter unsuitable for use in a variety of radio systems.

At present, to reduce the temperature capacitance coefficient with the aim of stabilizing the capacitance within a specified temperature range, various changes are made in the circuit, i.e., additional elements are introduced, such as Zener diodes or integrated circuits.

This, however, complicates the overall circuit of a radio system and affects certain electric parameters of the device, specifically the volt-fared characteristic.

The object of the present invention, therefore, is to provide a semiconductor diode with voltage-dependent capacitance so as to compensate for temperature variations.

Another object of the invention is to increase the operational reliability and stability of circuits using such devices within a wide temperature range.

This and other objects are accomplished in the inventive semiconductor diode with voltage-dependent capacitance of monocrystalline structure wherein the base layer is sandwiched between layers having a considerably lower resistivity than the base layer and forms a P-N junction with one of these layers. The base layer forms a forward-biased P-N junction with the other layer, having an area at least 20 times greater than that of the reverse-biased junction.

Such an device allows for the compensation of temperature capacitance coefficient variations through redistributing the voltages between the forward-biased and reverse-biased junctions, thereby ensuring a high reliability of the device and a stability of its parameters within a wide temperature range, specifically the volt-farad characteristic thereof.

More specifically, the invention relates to a semiconductor diode with a voltage-dependent capacitance, which comprises a semiconducting crystal having two outer layers of one type of conductivity and an intermediate layer of the opposite type of conductivity disposed between the outer layers; the intermediate layer having a resistivity substantially greater than that of the outer layers, and defining therewith two P-N junctions; one of the junctions being forward-biased and the other being reverse-biased; and electrodes connected to the outer layers for serial insertion of the diode into an electric circuit; the area of the forward-biased junction being by at least twenty times greater than that of the reverse-biased junction; the forward-biased junction including means that provide compensation for the temperature coefficient of the diode capacitance under temperature fluctuations.

These and other advantages of the invention will become apparent from the following description of an exemplary embodiment thereof, taken in conjunction with the accompanying drawing, the sale figure of which is a cross-sectional view of a device embodying the features of the invention.

The inventive semiconductor diode with voltage-dependent capacitance is based on a P-type monocrystalline silicon wafer 1 with a resistivity of 3 xcm. Sealed in the wafer 1 from opposite sides are aluminum electrodes 2 and 3, thus forming P-type aluminumalloyed layers 4 and 5 with a resistivity of about 0.03 .cm.

Thus, the structure is formed by alternate P-N-P-type layers, an N-type layer 6 whereof is the base layer with a resistivity 100 times higher than that of the two P-type layers. The ratio between the resistivity of the base layer 6 and that of the P-type layers 4 and 5 may vary. The P-type and N-type layers form two P-N junctions 7 and 8. The area of the P-N junction 7 is 20 times greater than that of the P-N junction 8.

The device is connected in an electric circuit so that the electrode 2 is reverse-biased between the two layers and has a higher resistivity than the latter, and forms therewith two P-N junctions, one of the junctions being placed, when connected in an electric circuit, under a potential that ensures a forward bias, while the other P-N junction has a potential providing for its reverse bias.

This bias blocks the P-N junction 8 initiating the barrier capacitance of this junction. The capacitance of the blocked P-N junction 8 determines the capacitance value of the capacitor and can be adjusted by varying the reverse bias.

The other P-N junction 7 remains under a positive potential, i.e., it is forward-biased. The forward bias unblocks this P-N junction and initiates the diffusion capacitance.

Considering that in the device according to the present invention the area of the P-N junction 8 is at least 20 times smaller than that of the P-N junction 7, the diffusion capacitance value is found to be negligible as compared to the barrier capacitance. The above objects are achieved also in that the area of the P-N junction under a positive potential, namely the voltage-dependent capacitance diode, is at least 20 times as large as the area of the P-N junction that is under the negative potential.

Let us consider the operating principle of the inventive semiconductor diode disclosed herein.

When a reverse bias voltage, e.g. $-4$ V, is applied, the temperature capacitance coefficient is $300.10^{-6}$ $1/°C$, i.e., at a temperature variation of 10°C and a fixed bias voltage, the capacitance varies by 0.3 percent. To compensate this variation, it is required and sufficient to change the attained bias voltage by means of the forward-biased P-N junction 7. This is accounted for by the following.

The P-N junctions 7 and 8 are connected in a series circuit. Temperature variations bring about respective changes in the bias voltage at the forward-biased P-N junction 7, i.e., as temperature increases, the voltage at the P-N junction 7 drops to some extent, which in turn results in a respective voltage increase at the reverse biased P-N junction 8. This voltage variation is sufficient for the compensation of the temperature capacitance coefficient variation without affecting either the volt-farad characteristic or the capacitance rating value.

The extent to which the temperature capacitance coefficient variation can be compensated for depends, at a given ratio between the P-N junction areas, on the selected temperature range. If, for example, the area of the forward-biased junction 7 is 30 to 50 times greater than that of the reverse-biased junction 8, the temperature capacitance coefficient variation is most effectively compensated within a temperature range of ± 60°C. An extension of the temperature range results in a partial compensation of the variation; for instance, at a temperature range of +60° to +120°C, the temperature capacitance coefficient variation is compensated only by 40 to 50 percent.

What is claimed is:

1. A semiconductor diode with a voltage-dependent capacitance, comprising a semiconducting crystal having two outer layers of one type of conductivity and an intermediate layer of the opposite type of conductivity disposed between said outer layers; said intermediate layer having a resistivity substantially greater than that of said outer layers, and defining therewith two P-N junctions; one of said junctions being forward-biased and the other being reverse-biased; and electrodes connected to said outer layers for serial insertion of the diode into an electric circuit; the area of said forward-biased junction being by at least twenty times greater than the area of said reverse-biased junction; said forward-biased junction including means providing compensation for the temperature coefficient of the diode capacitance under temperature fluctuations.

2. The semiconductor diode as defined in claim 1, wherein said crystal is made of a material selected from the group consisting of silicon, germanium and gallium arsenide.

3. The semiconductor diode as defined in claim 2, wherein said P-N junctions are formed with the use of a material selected from the group consisting of boron, aluminum, indium, phosphorus, arsenic, antimony and alloys thereof, zinc being used in conjunction with the gallium aresenide.

* * * * *